United States Patent [19]

Mersereau et al.

[11] 3,854,973

[45] Dec. 17, 1974

[54] METHOD OF MAKING ADDITIVE PRINTED CIRCUIT BOARDS

[75] Inventors: Mark Mersereau, Cheshire; Harold L. Rhodenizer, Bethlehem; John J. Grunwald, New Haven; William P. Innes, Cheshire, all of Conn.

[73] Assignee: MacDermid Incorporated, Waterbury, Conn.

[22] Filed: Aug. 16, 1972

[21] Appl. No.: 280,956

Related U.S. Application Data

[60] Division of Ser. No. 5,881, Jan. 26, 1970, Pat. No. 3,698,940, which is a continuation-in-part of Ser. No. 834,982, June 20, 1969, abandoned.

[52] U.S. Cl......... 117/47 A, 117/138.8 R, 117/213, 117/217

[51] Int. Cl............................................... C23c 3/00

[58] Field of Search...... 117/212, 130 E, 213, 47 A, 117/217, 138.8 R; 106/1; 204/30

[56] References Cited

UNITED STATES PATENTS

| | | | |
|---|---|---|---|
| 3,607,350 | 9/1971 | Rathsack | 117/47 |
| 3,698,940 | 10/1972 | Mersereau | 117/213 |
| 3,709,727 | 1/1973 | Miller | 117/47 |
| 3,779,840 | 12/1973 | Walles | 117/47 A |

*Primary Examiner*—Charles E. Van Horn
*Assistant Examiner*—J. Massie
*Attorney, Agent, or Firm*—Steward & Steward

[57] ABSTRACT

Substrates are disclosed for use in forming printed circuit boards by the additive process, in which the surface of the substrate is contacted with a particular class of solvents, activated for electroless deposition of the metal thereon, and at one or more points in the process the board is heated or baked.

1 Claim, 6 Drawing Figures

METHOD OF MAKING ADDITIVE PRINTED CIRCUIT BOARDS

Figure 1:
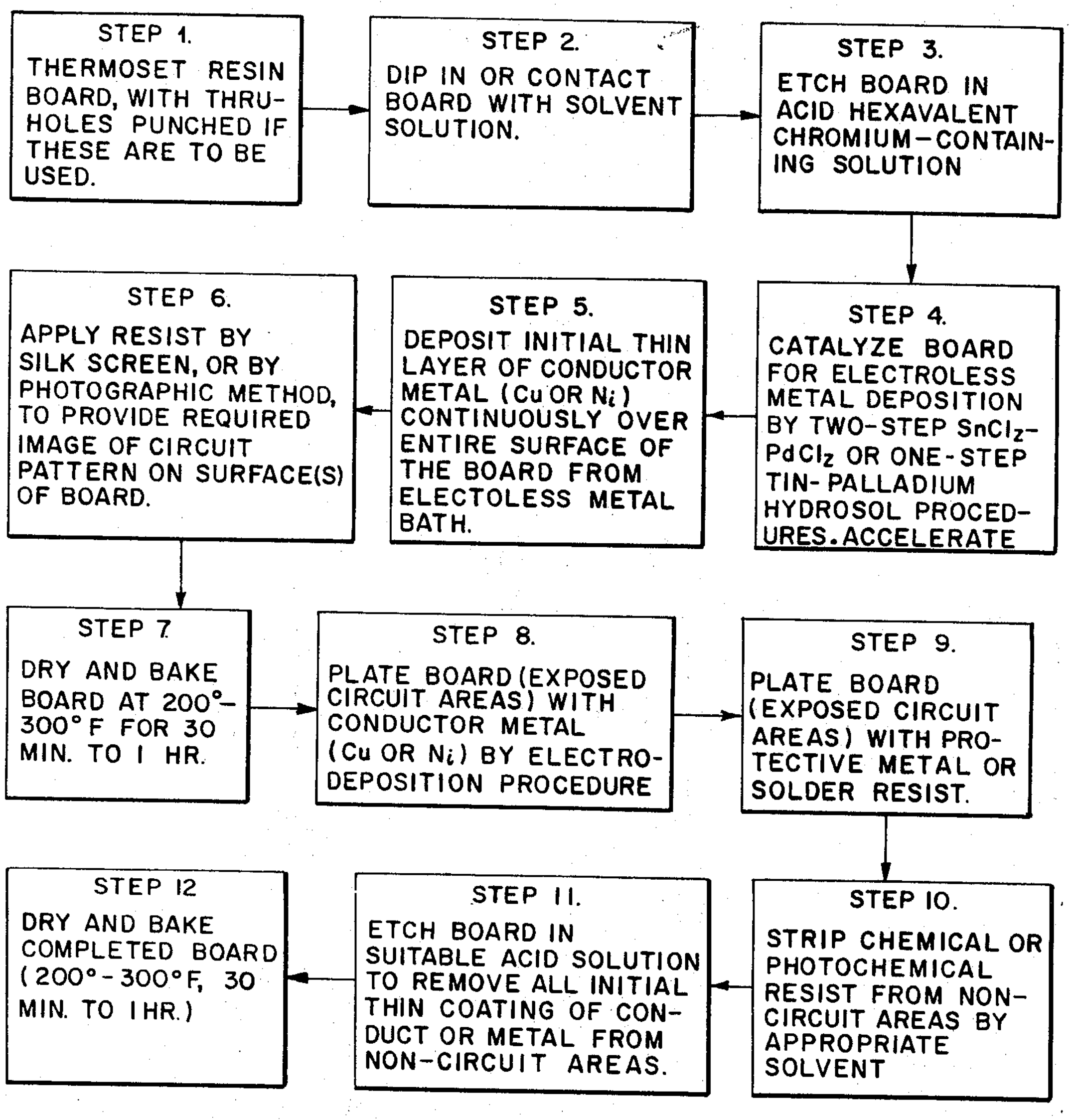

This application is a division of application Ser. No. 5,881, filed Jan. 26, 1970, now U.S. Pat. No. 3,698,940, which was a continuation-in-part of application Ser. No. 834,982, filed June 20, 1969 now abandoned.

This invention relates to articles of manufacture having particular utility in making printed circuit boards by the additive plating process, and more particularly to substrate members activated for direct plating with metal by immersion in an electroless metal plating bath to provide a deposit thereon exhibiting superior bonding of the plated metal to the surface of the non-conductive substrate member. The invention is directed to substrate members comprised of thermoset resin materials, such thermoset materials being particularly desirable for printed circuit board use, and particularly to epoxy resin-fiber glass reinforced substrate members of the type known commercially as G–10 boards.

Two distinct methods of manufacture of printed circuit boards for use in electronic equipment have, in general, been proposed in the prior art. One is termed the "subtractive" method and is the one used predominately at the present time. The other method is called the "additive" procedure.

The manufacture of the printed circuit by the "subtractive" method starts with a laminate or composite consisting of a sheet of insulating material as a base or substrate, one or both sides being covered with a thin copper foil on the order of 0.001 inch or 0.002 inch thick. The foil is secured to the insulating base by means of an appropriate adhesive or by the application of heat and pressure in forming the laminated structure. The substrate or insulating base used to support the conductive circuit is usually made in the form of a flat sheet of molded G–10 or sometimes phenolic resin material.

After the configuration of the desired electric circuit to be printed on the board has been designed, the "art work" is prepared which consists of a positive or negative transparency or silk screen bearing the desired circuit image. In the photographic reproduction method, the copper-sheathed plastic substrate is covered with a photosensitive resist, this being generally a liquid polymeric preparation which includes light-sensitive initators and becomes solvent-resistant after exposure to ultraviolet radiation of a particular frequency. A latent image of the desired circuit is formed in the photoresist on the surface of the board by exposure through the transparency, and this image is developed in an appropriate solvent which removes the unexposed photoresist material. Using the silk screen method, a chemical resist is squeegeed through the screen onto the board to give the described pattern. In the print and etch version of the "subtractive" method, therefore, the resist coating formed on the board is a positive image of the desired circuit so that the copper foil to be retained on the surface of the board is covered with photoresist material. The remaining portion of the copper foil, corresponding to the non-circuit areas of the final printed board, is left unprotected and is then etched away in a suitable solution, commonly ferric chloride or an ammoniacal solution of the type described in U.S. Pat. No. 3,231,503. The resulting circuit board containing the desired circuit configuration is then treated in a suitable solvent to strip the remaining resist coating on the retained copper foil, and is ready for additional plating or solder application, mounting of accessory electronic components, etc.

In a modification of this procedure, where a circuit board is provided with copper laminates on both sides and it is desired to form conductor circuits on these opposite faces with electrical interconnection between certain areas on the opposite faces, through-holes are drilled or punched through the boards as required, and the walls of these holes are plated with a metal to electrically interconnect the opposed surface conductor areas. Therefore before the copper clad boards can be put through the "subtractive" method of forming the desired printed circuits on their opposite faces, they must be subjected to a series of operations designed to electrolessly plate a thin deposit of copper, nickel, etc., on the walls of the through-holes to join the surface conductor areas. The procedure here is well-known in the art and generally involves punching the holes, cleaning and copper-clad faces of the laminate, etching or pickling and then catalyzing, followed by electroless deposition (or in some cases by direct electrodeposition) of copper over the entire exposed surface, including the non-conductive walls of the through-holes in the plastic substrate as well of course as the copper-clad faces of the substrate. After applying a circuit pattern of organic or polymeric masking resist, the conductor areas (i.e., circuit areas) are electrolytically plated with conductor metal to desired thickness and then covered with a metallic resist (e.g., tin-lead alloy). The organic resist is then stripped by a suitable solvent, leaving the non-circuit areas of copper exposed, and this is removed by a suitable acid or alkali etchant solution.

A major drawback of the foregoing "subtractive" method resides in the necessity to initially apply and then etch away substantial amounts of copper in order to produce the desired circuit configuration. Not only does etching pose a waste disposal problem because of the toxic nature of most etching solutions, but more seriously, in the course of etching, a phenomenon known as "undercut" is encountered. Undercut is the term of art employed to describe the lateral undermining of the conductor area in the resulting circuit configuration formed on the surface of the board. In fact, this phenomenon of undercutting greatly limits the fineness or narrowness of the conductor areas that can be tolerated; that is, these conductor areas must be overdesigned from a width standpoint to allow for such undercut. This of course impedes attempts toward further miniaturization of the circuit boards. Also, where the nature of the circuit requires the use of the heavier or thicker copper foil on the surface of the plastic substrate, a longer residence time of the board in the etching solution must be maintained, during which there is an inherent tendency for the resist material itself to be undermined and partially removed in some areas of the board, thereby causing rejects.

Thus the problem in following the so-called "subtractive" method of producing printed circuit boards is not only one of economics due to the fact that copper is first laminated to the board and then a large portion of it etched away; but, more seriously, is one of greatly limiting the design, insofar as space requirements are concerned, of the desired printed circuits.

An alternative to the "subtractive" process discussed above has been proposed heretofore, and is known as the "additive" method of manufacturing such boards. This procedure starts with a non-conductive board, free of any copper foil laminate, to which a circuit is applied by plating to deposit conductor metal directly on the desired areas of the board. The procedure obviously presents a number of advantages over the "subtractive" method and many attempts have been made to produce suitable additive circuit boards. To date, however, these attempts have not proved too satisfactory in commercial production. The major obstacle to a successful "additive" printed circuit board is the difficulty of obtaining adequate adhesion between the chemically deposited copper or other conductive metal and the dielectric substrate. One of the more recent procedures that has been developed is described in "Transactions of the Institute of Metal Finishing", 1968, Vol. 46, pages 194–197. The procedure there described involves the successive steps of treating the surface of the bare substrate board with a "keying" agent, punching the board to provide the necessary through-holes, plating a very thin initial deposite of nickel over the entire surface using an electroless nickel bath, then applying and developing a resist to form a negative image of the desired circuit pattern, followed by additional metal plating by conventional electrodeposition techniques to build up the conductor portions of the circuit to the desired thickness. After this the resist is stripped and the printed circuit board is etched to completely strip away the initial, thin, electroless metal deposit from the non-circuit areas, leaving only the heavier plated, i.e. the circuit areas, on the board. The board is then treated in the usual way to provide a protective film of precious metal or lacquer on the printed conductor circuit, or alternatively to cover this with a solder coating to facilitate connection of the usual accessory electronic components incorporated into the finished circuit board.

The foregoing method has certain advantages, particularly in that it facilitates electrodeposition of the conductor circuit and avoids or reduces the need of further electroless plating operations. However, a difficulty with this method resides in its use of a "Keying" agent which, although not fully identified in the foregoing article, appears to be a polymeric coating. Careful preparation and application of this coating material is required in order to obtain effective and consistent results. Furthermore, as in most cases where attempts have been made to use adhesives as intermediates for bonding copper, or other conductor metals to a plastic substrate, there are always problems in obtaining proper dielectric properties of the adhesive, accurate and consistent reproducibility of the polymeric bonding material, and avoiding fragility or brittleness of the bond, to name but a few. It appears also that the reference process is better suited to thermo-plastic resin substrates rather than thermosetting substrates, although the latter are much preferred for electronic applications.

It is the primary purpose of this invention to provide an article of manufacture comprising a thermoset resin substrate activated to receive and retain an electroless metal deposit thereon without the use of polymeric adhesive coatings, but which nevertheless exhibit satisfactory adhesion between the copper or other conductive metal electrolessly deposited and the dielectric substrate; and more particularly to such activated thermoset resin substrates comprised of the G–10 and phenolic types mentioned.

In brief, the articles of manufacture of this invention are the resulting product of a process which involves initially immersing or otherwise contacting the dielectric substrate with an organic solvent of the class described generically hereinafter but one of which the presently preferred specific examples are N,N-dimethylformamide, formamide, N-methyl pyrrolidone, N,N-dimethyl acetamide and diemthyl sulfoxide. This step is followed by immersion in an appropriate chromic-sulfuric oxidizing solution catalyzing of the board with an appropriate electroless plating catalyst. The resulting substrate constitutes an article of manufacture which is ready for direct electroless plating by then either applying a thin initial deposit of conductive metal over the entire surface of the board, followed by application of a resist to form a suitable image of the desired circuit pattern, as described in the foregoing reference article; or alternatively, by applying and developing a resist immediately after the catalyzing step to provide a suitable image of the desired circuit pattern. In either case this is followed by further electrolytic or electroless deposition, respectively, of conductor metal to build up the desired final thickness of the circuit conductors on the board.

Both procedures just described are satisfactory, each having some inherent advantages that may make it preferable over the other in a particular application. For example, the first procedure mentioned affords a means of employing electrodeposition in the formation of the conductor circuit pattern, and this is inherently less expensive than electroless deposition procedures. However, using that method requires a final etching step to remove the initial thin continuous coating of conductive metal, after the build-up of the circuit has been completed.

Whichever of the two procedures here described is employed, it is important that the substrate member, either before or after being plated, be heated or baked to promote effective bonding between the conductor and the resin substrate. Such heating or baking operation can be carried out at any one or more points, e.g.: (a) following the catalyzing step; (b) after application of the continuous initial thin conductor metal layer; (c) application of the resist; (d) development of the resist circuit pattern; or (e) after completion of the circuit board, depending on which procedure is used. While such heating or baking is not required at all of these stages, it is always required at one or another following the catalyzing stage and is instrumental in obtaining good adhesion.

While the mechanisms of better adhesion through the combination of preliminary solvent treatment and subsequent baking step are not as yet well understood, it appears that the combination helps to produce a more intimate contact between the substrate and the conductive metal layer, and in any event the resulting product possesses substantially improved properties in terms of peel strength.

One of the problems associated with the preparation of circuit boards by the "additive" process is that, during the step of treating thermoset substrates reinforced with glass fiber with the organic solvents set forth above and/or during the etching process the bare fiber of the glass cloth reinforcement is likely to become partially exposed on the substrate surface with the result that the physical properties of the surface and especially the electrical properties are impaired. When an attempt is made to form a plated metal coating on such a substrate surface the result is usually a rejected part due to poor coverage, etc.

It has been found that the stripping of the plastic down to the bare fiber of the glass cloth during the solvent treatment and/or etching step can be avoided by utilizing a reinforced thermoset resin substrate having a surface coating of the thermoset resin with a thickness of about 0.0010 to about 0.0050 inch and preferably about 0.0015 to about 0.0038 inch over the glass fiber reinforcement in the substrate body.

A typical, highly useful reinforced resin substrate having a surface coating of the desired thickness can be prepared, for example, by painting glass cloth of plain weave having a thickness of 0.0040 inches (1.44 oz./sq. yd. weight) with an epoxy varnish of the following formulation:

| | Parts |
|---|---|
| Diepoxide resin in acetone[1] | 125 |
| Dicyandiamide | 4 |
| Dimethyl formamide | 15 |
| Methyl ether of ethylene glycol | 15 |
| Benzyldimethylamine (BDMA) | 0.3 |

1 - Prepared by reacting bisphenol A and epichlorohydrin. The varnish is formulated by blending the dimethyl formamide, the methyl ether of ethylene glycol and the dicyandiamide following which the blend is heated to 110°F. After cooling to room temperature, the resin solution is added with additional acetone, as desired, and finally the solution is thoroughly agitated at least 8 hours before using.

The cloth with the initial varnish coat was allowed to air dry for 15 minutes and then heated at 350°F. for 6 minutes to form a B-stage material. Following cooling, the B-stage resin was again painted with epoxy varnish, allowed to air dry for 15 minutes and again baked for 6 minutes at 350°F. The resulting substrate was cured by pressing at 350°F. for 45 seconds at 50 p.s.i. and then for 30 minutes at 350°F. at 500 p.s.i. The thickness of the coating over the glass cloth in the outer layer of the resulting laminate was measured and found to be between 0.0023 and 0.0032 inch.

Any of a wide variety of epoxy resin varnishes known in the art may be employed to surface coat the resin substrate. Application of the varnish can be accomplished by brushing, spraying, roller coating or the like in a thin layer of uniform thickness. One or more epoxy varnish coats can be applied depending on the desired thickness of the final coating.

In the accompanying flow sheets, various combinations of steps are shown as illustrative of procedures that may be utilized in preparing an article of manufacture of the present invention. In the further discussion of the invention, reference will accordingly be made to the drawings in which:

FIGS. 1 through 6 inclusive represent block flow diagrams of the steps involved in several different procedures for preparing circuit boards in accordance with this invention.

Discussion of some of the procedures that can be followed will be helpful to a further understanding of the invention.

EXAMPLE I

With reference to FIG. 1 of the accompanying drawings, the various major steps in the preparation of a completed printed circuit board are given in flow diagram form. It will of course be understood that conventional process steps, such as water rinsing where required, have been omitted from this flow diagram but their use as needed will be obvious to those experienced in this art.

Starting with Step 1, a bare substrate board, with through-holes already punched in it if these are to be used in the completed circuit board, is cleaned of any surface grime. As previously mentioned, molded thermoset resin of glass-epoxy (G–10) or phenolic base type generally is desired for dielectric properties as well as resistance to structural deformation or warping due to temperature and humidity variations.

In Step 2, the clean bare resin board is dipped in or otherwise contacted with a solvent solution designed to penetrate into the surface of the board and modify its chemical and/or physical condition to promote a more effective bond with subsequently applied conductor metal, as will be more fully discussed below.

The solvents found to be most suitable in the foregoing step are N,N-dimethylformamide, formamide, N-methyl pyrrolidone, N,N-dimethylacetamide and dimethyl sulfoxide. A substantial number of other organic liquids of the classes defined hereinafter are likewise useful. These solvents may be used at full strength or may be diluted, e.g. with water. A rather wide range of parameters will be applicable here depending on the particular substrate resin involved, concentration of the solvent, temperature of the solvent bath and time of contact or immersion of the substrate in the bath. The criterion determining the selection of the particular solvent concentration, bath temperature and immersion time is the securing of satisfactory adhesion between the subsequently plated conductor metal and the substrate. Satisfactory adhesion is considered to be five pounds per inch "peel strength" as a minimum.

A particularly desirable set of conditions found to be operative consists in using dimethylformamide diluted 50% with water in a bath at ambient room temperature with a holding or residence time for either glass-epoxy or phenol-aldhyde resin substrate of one to five minutes. Peel strengths of substantially better than the five pound per inch minimum are consistently obtainable under these conditions. Desirably the lowest degree of roughening of the substrate that is still conducive to obtaining the minimum stated adhesion is preferred. Obviously longer immersion times, higher operating temperatures and greater solvent concentrations will increase the degree of roughening proportionately and, in general, improve adhesion. But there is a balance that must be drawn for any particular situation between the degree of roughening that can be tolerated and the amount of adhesion that is desirable.

Following a water rinse, etching of the board in Step 3 can be suitably effected by immersing the board in an aqueous sulfuric-chromic acid solution. A suitable composition for this consists of 30 to 60 parts by weight of sulfuric acid (66°Be), 5 to 10 parts by weight of chromic acid, and 30 to 65 parts by weight water. Holding the board in this solution for 3 to 5 minutes at ambient room temperature normally produces adequate etching.

Again after a suitable water rinse the board is catalyzed at Step 4 by either the two-step activation procedure using stannous chloride in hydrochloric acid for sensitizing and palladium chloride in hydrochloric acid for nucleation, a well known procedure as described in the previously-mentioned reference article; or the catalysis may be effected by the one-step procedure employing a tin-palladium hydrosol such as that disclosed in the U.S. Pat. No. 3,532,518.

Usually also it is desirable to subject the catalyzed board to an accelerating solution, for example a dilute solution of fluoboric acid, although this is not always essential.

After rinsing, the board is plated at Step 5 in an electroless metal plating bath of copper or nickel. Any of the commercially available electroless copper or nickel baths is suitable. Typical compositions of such baths are shown in U.S. Pat. Nos. 2,874,072; 3,075,855 and 3,095,309 for copper; and 2,532,283; 2,990,296 and 3,062,666 for nickel. The metal deposit here desired is only a very thin but continuous layer of the order of 20 to 30 millionths of an inch over the entire surface of the board, as well as the wall surfaces of any through-holes that may be present. Its purpose is merely to provide a temporary conductive surface which will interconnect all of the circuit areas to be printed on the board in order to facilitate electrodeposition of such circuit areas in subsequent steps.

Again after adequate rinsing, the board is advanced at Step 6 to a station where a resist coating is applied to the surface or surfaces on which the conductive circuits are to be foremed. Here again the operator is afforded a choice of several methods in the selection and application of the resist coating, all of which are known and conventional in the art. Under one method the circuit design may be outlined by a chemical resist applied by squeegeeing it through an appropriate silk screen designed to produce coverage of the non-circuit areas of the board while leaving the circuit areas themselves free of resist material. Under the alternate resist application procedure, a photoresist composition is applied to the entire surface of the board and this is exposed to a suitable light source through a positive transparency or film of the desired circuit, and the photoresist material is then developed by an appropriate solvent to strip away the unexposed (circuit area) photoresist material on the board. In either case the board is then dried at Step 7 to cause the resist coating to firmly adhere to the surface. While heating is necessary for setting the resist composition so that it will withstand the subsequent operations performed on the board, it also may serve as the baking operation referred to hereinabove as being an integral part of this invention. In this event, it is preferred to heat the board to a temperature of approximately 220°F. for a period of about 30 minutes. Considerable latitude in the temperature and time is possible, and in general lower temperatures will require proportionately longer times and vice versa. Practical operating conditions dictate the use of baking temperatures substantially above ambient, and preferrably at or above the boiling point of water if atmospheric pressure is maintained. Obviously the temperature employed cannot be so high as to cause warping or charring of the resin substrate.

In this Example I, the board is now ready at Step 8 for plating of the exposed circuit areas to build up a desired thickness of conductor metal in those areas. By providing the initial continuous thin metal deposit, conventional electrodeposition of additional conductor metal or metals on the circuit areas is greatly facilitated since a single connection at any point on the conductive surfaces of the board will effect electrodeposition of metal at all exposed circuit areas when the board is made the cathode in a conventional electrolytic plating bath. Copper or nickel is conventionally used as the conductor metal, and the plating operation is continued to build up a sufficiently thick deposit of such metal to meet the requirements of the electronic circuit in which the board is used.

Subsequent plating of the circuit areas in Step 9 with a protective metal such as gold, silver, or with solder as a resist or to facilitate subsequent attachment of accessory electronic components to the board, can also be effected by electrochemical deposition from suitable metal plating solutions. After the conductor circuit has been completely built up, the board is then subjected at Step 10 to a stripping solution to remove the chemical or photochemical resist from the non-circuit areas. This leaves the surface of the board still covered with the thin initial conductor metal deposit over the entire surface. This coating is then removed at Step 11 by immersing the board in a suitable acid, i.e. one which will not attack the metallic resist, to strip the noncircuit areas of any conductive metal.

The finished board is then rinsed, dried and baked at Step 12. If the procedure followed has not incorporated baking the board at approximately 220°F. for 30 minutes at one of the earlier steps, this can take place at this point in the process.

EXAMPLE II

Figure 2:
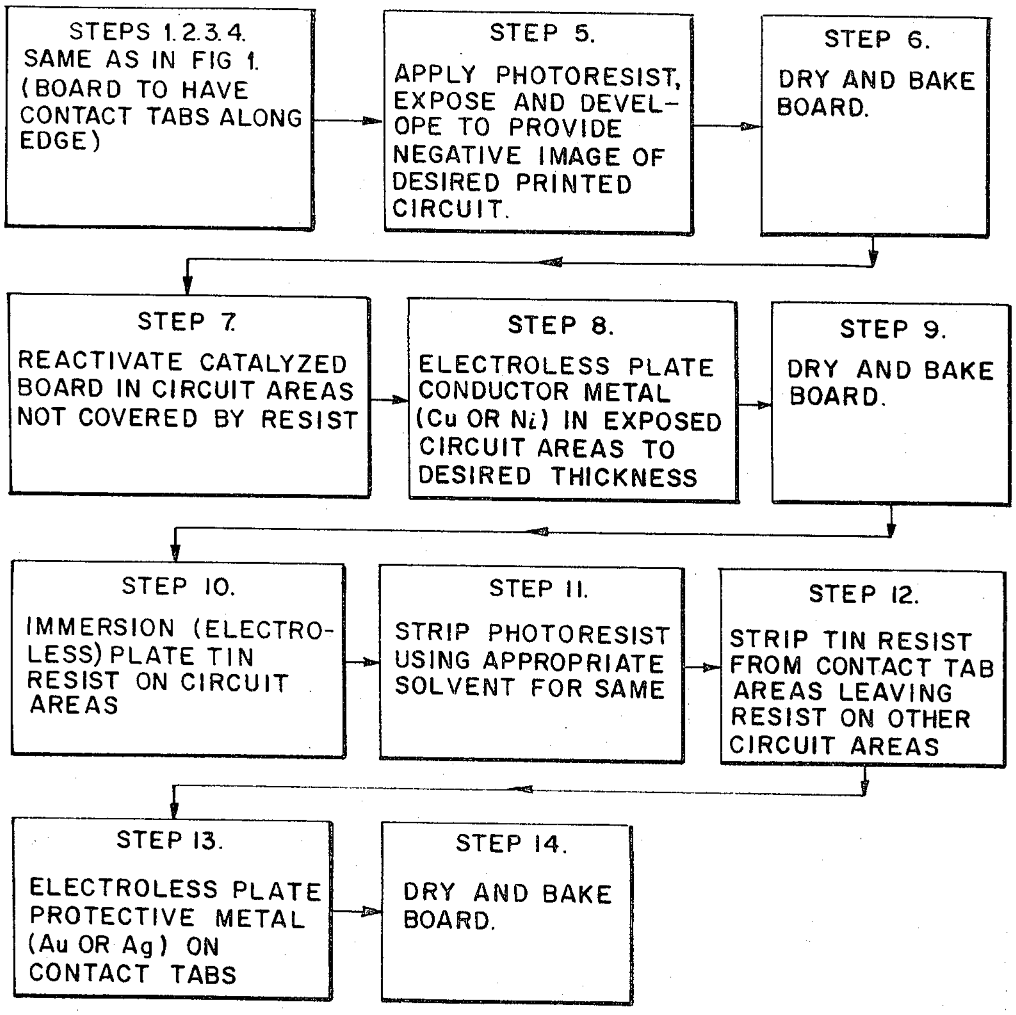

A modified procedure is shown in the flow diagram of FIG. 2. In this example the substrate board employed is a molded thermoset resin of the epoxy type reinforced with glass cloth which has an epoxy surface coating with a thickness of about 0.0023 inch over the glass cloth. Here again the initial solvent treatment of the substrate is employed and the board is etched in a chromic-sulfuric solution and catalyzed for electroless deposition, all as in the first four steps of Example I. In this Example II, the board is then coated at Step 5 with a photo-resist and the desired circuit configuration is exposed through a transparency and the photoresist composition developed to provide an image of the desired printed circuit, as before. The board is dried, baked at Step 6 and preferably is subjected to a dilute sulfuric acid solution at Step 7 to reactivate the exposed catalyzed resin surface in the circuit areas. Electroless nickel or copper at Step 8 is then deposited in the exposed circuit areas to the total desired thickness, and the board again dried and baked at Step 9. An immersion coating of tin, tin alloy or other suitable protective coating is applied at Step 10 to the exposed conductor or circuit area, and the photoresist is stripped from the non-circuit area using an appropriate solvent for the particular resist material employed. This provides a finished board unless it is desired to further plate contact tab areas commonly incorporated in a typical circuit board with a precious metal such as gold or silver to improve the contact surface. In this event, the tin resist is stripped at Step 10 from the contact tab areas and the board subjected to further electroless plating at Step 11 in a gold or silver electroless plating bath. Intervening reactivation steps may be necessary here if the underlying conductor metal previously deposited is not sufficiently reactive to the precious metal electroless baths to effect autodeposition. Again the board is dried and baked at Step 12, and if it has not previously been submitted to an elevated baking operation of the type described above, this step may be included at this point.

EXAMPLE III

Figure 3:
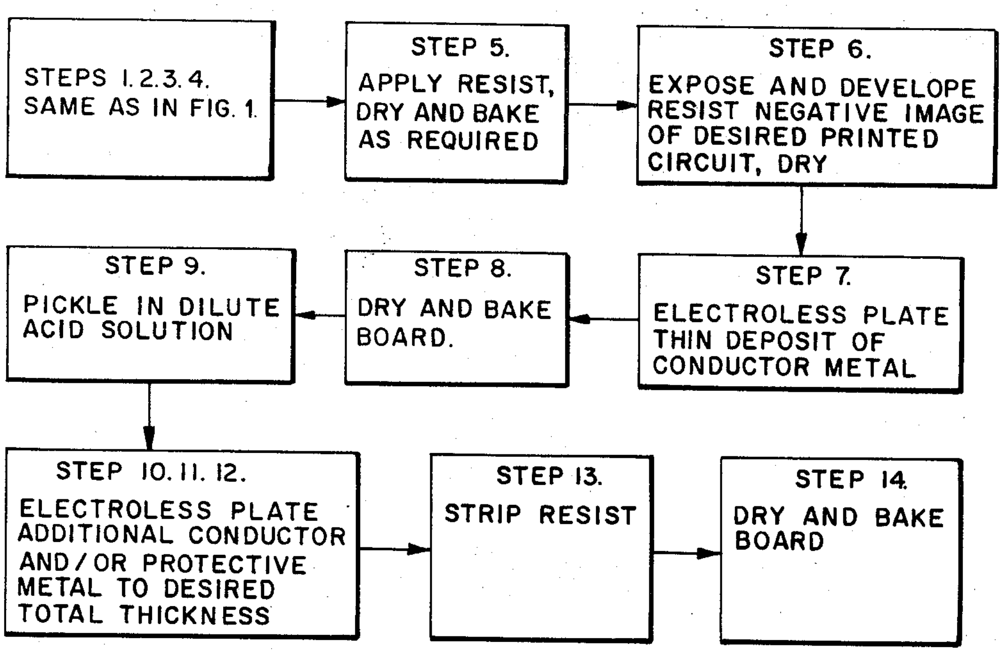

The procedure illustrated in FIG. 3 is essentially similar to that shown in FIG. 2, but in this instance the resist coating at Step 5 is baked before exposure and development. After development of the resist (Step 6) only a very thin (20 to 30 millionths of an inch) deposit of conductor metal is deposited initially from an electroless plating bath of the metal (Step 7), and the board is then dried and baked at approximately 220°F. for 30 minutes (Step 8). The board is picked in dilute 10% sulfuric acid solution (Step 9) to reactivate the initial conductor metal deposit for subsequent electroless plating of copper, nickel and gold in that order (Steps 10, 11, 12), followed by stripping of the resist composition (Step 13) and further drying and baking of the finished board.

EXAMPLE IV

Figure 4:
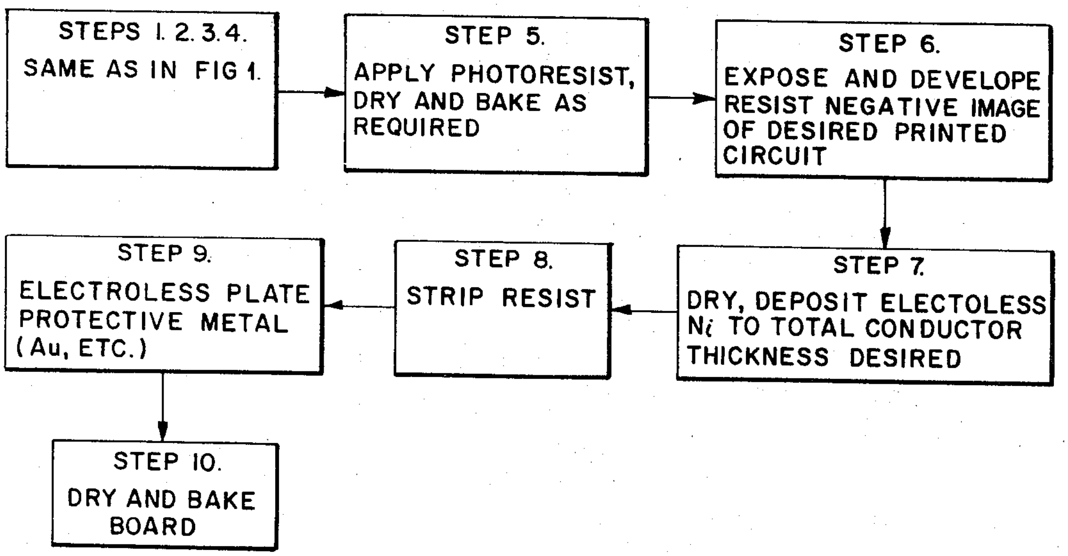

An all-nickel conductor circuit is produced in this example, as diagrammatically shown in FIG. 4. The same general sequence of steps is employed, the difference from Example III being that the process is shortened by omitting one baking step and the acid pickling, which is usually not necessary where the plated conductor metal is nickel.

EXAMPLE V

Figure 5:
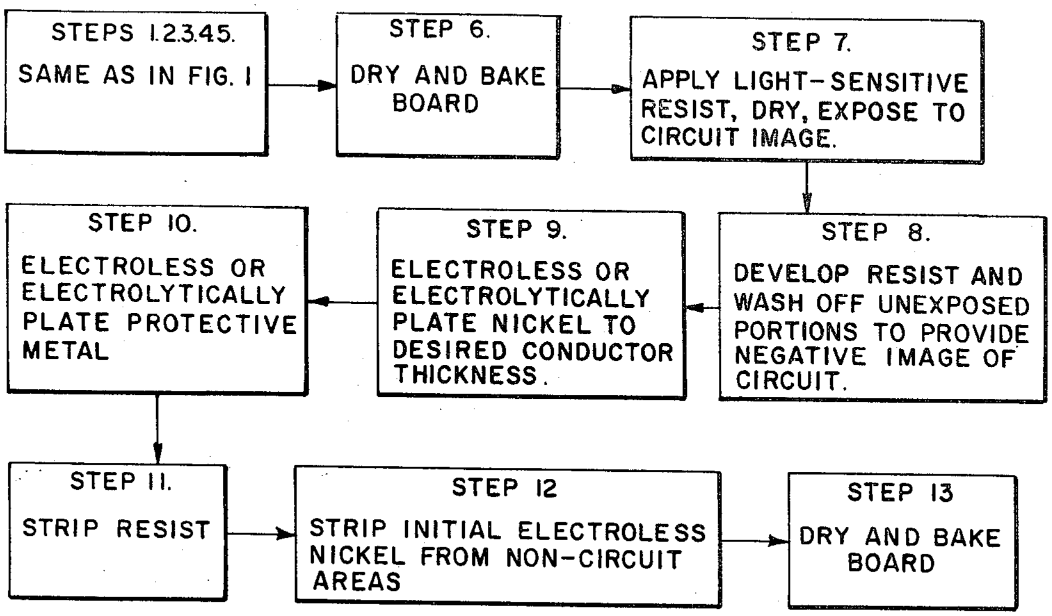
Figure 6:
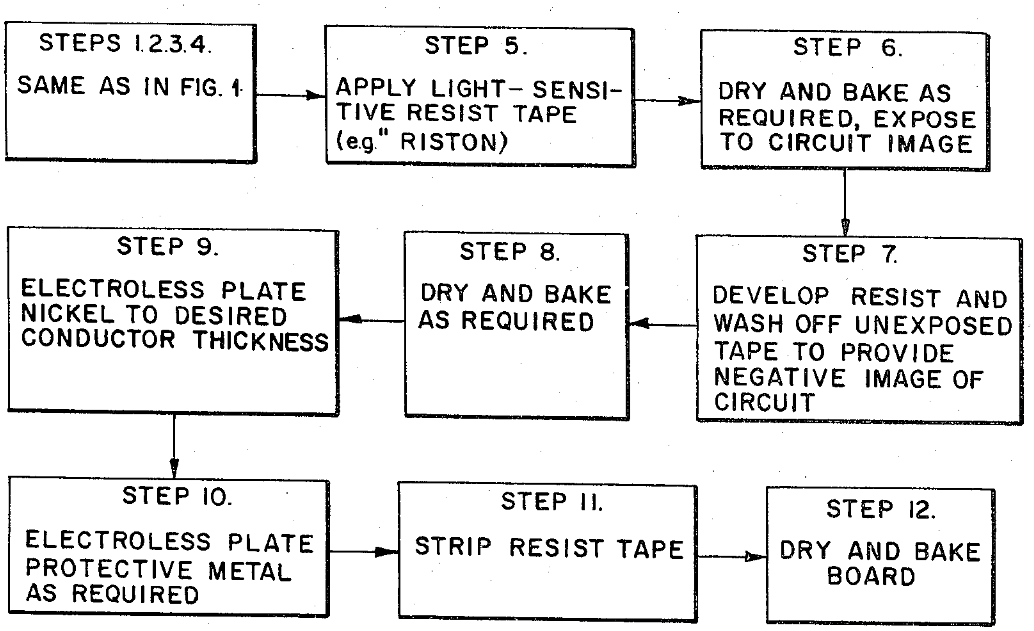

Another example of an all-nickel printed circuit is illustrated by the sequence of steps shown in FIG. 5. The procedure is otherwise essentially the same as that of Example I.

EXAMPLE VI

This illustrates a sequence employing only electroless metal deposition technique in building up the desired circuit, and a different type of resist.

The foregoing examples illustrate solvents which are presently preferred in treating the surface of the substrate board in Step 2 of the process, for reasons of economy and availability. In general, however, those solvents that are suitable for use in the method of this invention include dipolar aprotic organic liquids having dielectric constants exceeding 5.0 and falling into one of the three general classes of compositions, namely Compositions I, II and III, wherein Compositions I are those having the formula:

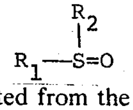

wherein $R_1$ is selected from the group consisting of hydrogen and alkyl of from 1 to 5 inclusive carbon atoms and $R_2$ is alkyl of from 1 to 5 inclusive carbon atoms; Compositions II are those having the formula:

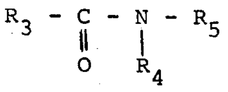

wherein $R_3$ is selected from the group consisting of hydrogen and alkyl of from 1 to 3 inclusive carbon atoms, $R_4$ is selected from the group consisting of hydrogen and alkyl of from 1 to 5 inclusive carbon atoms and $R_5$ is selected from the group consisting of hydrogen and alkyl of from 1 to 5 inclusive carbon atoms; and Compositions III are those having the formula:

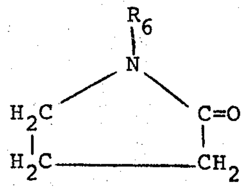

wherein $R_6$ is alkyl of from 1 to 5 inclusive carbon atoms.

Specific solvents within the foregoing general definitions of the three classes of compositions are given below:

I methyl sulfoxide
dimethyl sulfoxide
diethyl sulfoxide
n-propyl sulfoxide
diisopropyl sulfoxide
methyl ethyl sulfoxide
methyl n-amyl sulfoxide
isopropyl n-amyl sulfoxide
di-n-amyl sulfoxide

II formamide
n-ethyl formamide
N,N-dimethyl formamide
N, N-dimethyl acetamide
N-ethyl propionamide
N-n-propyl-N-amyl acetamide
N,N-di-n-butyl propionamide
N-ethyl n-butyramide
N,N-diisopropyl n-butryamide

III

N-methyl pyrrolidone
N-ethyl pyrrolidone
N-isopropyl pyrrolidone
N-n-butyl pyrrolidone
N-isoamyl pyrrolidone

What is claimed is:

1. An article of manufacture comprising a substrate member activated for direct plating with metal by immersion in an electroless metal plating bath to provide an adherent metal deposit thereon, wherein said substrate member is composed of a molded polymerized thermoset resin, said member being prepared by:

a. contacting the surface of the substrate member with a dipolar aprotic organic liquid solvent of the group consisting of Compositions I, II and III, wherein Compositions I are those having the formula:

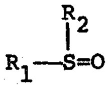

wherein $R_1$ is selected from the group consisting of hydrogen and alkyl of from 1 to 5 inclusive carbon atoms, and $R_2$ is alkyl of from 1 to 5 inclusive carbon atoms; Compositions II are those having the formula:

wherein $R_3$ is selected from the group consisting of hydrogen and alkyl of from 1 to 3 inclusive carbon atoms, $R_4$ is selected from the group consisting of hydrogen and alkyl of from 1 to 5 inclusive carbon atoms, and $R_5$ is selected from the group consisting of hydrogen and alkyl of from 1 to 5 inclusive carbon atoms; and Compositions III are those having the formula:

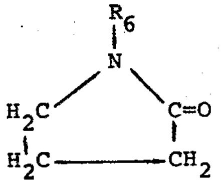

wherein $R_6$ is alkyl of from 1 to 5 inclusive carbon atom;

b. contacting the solvent-treated surface of the substrate member with an aqueous hexavalent chromic acid solution;

c. contacting the surface of the member with an aqueous solution of a precious metal to catalyze said surface; and d. heating the catalyzed substrate member at a temperature above ambient but substantially below that at which charring of the resin occurs.

* * * * *